(12) United States Patent  
Kawai

(10) Patent No.: US 7,361,944 B2  
(45) Date of Patent: Apr. 22, 2008

(54) ELECTRICAL DEVICE WITH A PLURALITY OF THIN-FILM DEVICE LAYERS

(75) Inventor: Hideyuki Kawai, Fujimi-cho (JP)

(73) Assignee: Seiko Epson Corporation (JP)

( * ) Notice: Subject to any disclaimer, the term of this patent is extended or adjusted under 35 U.S.C. 154(b) by 212 days.

(21) Appl. No.: 11/061,519

(22) Filed: Feb. 22, 2005

(65) Prior Publication Data

US 2005/0206001 A1    Sep. 22, 2005

(30) Foreign Application Priority Data

Mar. 18, 2004    (JP)    .............................. 2004-078453

(51) Int. Cl.
*H01L 31/00*    (2006.01)
*H01L 21/4763*    (2006.01)

(52) U.S. Cl. ...................... 257/192; 257/197; 257/706; 257/720; 257/758; 438/590; 438/622

(58) Field of Classification Search ...................... None
See application file for complete search history.

(56) References Cited

U.S. PATENT DOCUMENTS

| | | | | |
|---|---|---|---|---|
| 4,939,568 A | * | 7/1990 | Kato et al. ................... | 257/686 |
| 5,051,865 A | | 9/1991 | Kato | |
| 5,087,585 A | * | 2/1992 | Hayashi ...................... | 438/155 |
| 5,702,963 A | * | 12/1997 | Vu et al. ..................... | 438/197 |
| 6,143,582 A | * | 11/2000 | Vu et al. ...................... | 438/30 |
| 6,424,020 B1 | * | 7/2002 | Vu et al. ..................... | 257/507 |
| 6,627,518 B1 | | 9/2003 | Inoue et al. | |
| 6,846,703 B2 | | 1/2005 | Shimoda et al. | |
| 2003/0057423 A1 | | 3/2003 | Shimoda et al. | |

FOREIGN PATENT DOCUMENTS

| | | | |
|---|---|---|---|
| JP | 58-091664 | | 5/1983 |
| JP | 60021553 A | * | 2/1985 |
| JP | 61-288455 | | 12/1986 |
| JP | 62-254459 | | 11/1987 |
| JP | 01-143349 | | 6/1989 |
| JP | 11-251517 A | | 9/1999 |
| JP | 11-251518 A | | 9/1999 |

* cited by examiner

*Primary Examiner*—Alonzo Chambliss  
(74) *Attorney, Agent, or Firm*—Harness, Dickey & Pierce, P.L.C.

(57) ABSTRACT

A highly reliable electrical device having a multilayered structure of a plurality of thin-film device layers and a method for manufacturing the same are provided. An electrical device includes a plurality of thin-film layers deposited and including a plurality of thin-film device layers each having a semiconductor device, and conductive layers with a predetermined thermal conductivity provided between adjacent thin-film layers. Examples of materials for the conductive layers include metals, metal compounds, resins with a metal or metal compound dispersed, and electrically conductive polymers.

11 Claims, 6 Drawing Sheets

ELECTRICAL DEVICE WITH A PLURALITY OF THIN-FILM DEVICE LAYERS

RELATED APPLICATION

This application claims priority to Japanese Application No. 2004-78453, filed Mar. 18, 2004, whose contents are explicitly incorporated herein by reference.

FIELD OF THE INVENTION

The present invention relates to a method for manufacturing an electrical device having a multilayered structure of a plurality of thin-film device layers, and more particularly applies to a highly reliable electrical device and a method for manufacturing the same.

BACKGROUND

Conventionally, in order to manufacture an electrical device having a multilayered structure of a plurality of thin-film device layers, such as three-dimensional integrated circuits (IC), a thin-film device layer including an active element, such as a field-effect transistor (FET), is firstly formed on a silicon substrate, and then subsequent thin-film device layers are directly formed on the first thin-film device layer by chemical vapor deposition (CVD) or other processes. In this method for manufacturing three-dimensional devices, the layers are deposited on top of each other on the same substrate. This may involve various restrictions on temperature or other factors in forming upper layers, so as to have no adverse influence on lower layers. It is also difficult to form thin-film device layers having different functions with optimum device parameters for each of the layers, such as the width of gate lines, the thickness of gate insulating films, design rules, and manufacturing conditions including temperature.

To address this issue, Japanese Unexamined Patent Publications No. 11-251517 and No. 11-251518, for example, describe methods for manufacturing three-dimensional devices that are capable of setting these device parameters adequately for each layer, without restrictions on manufacturing conditions made by an underlying layer. Thin-film device layers are deposited by a transfer process according to the methods.

However, the thickness of the thin-film device layers is as small as several micrometers, for example. If the thin-film device layers are deposited, active elements included in adjacent thin-film device layers come too close to each other. If a FET is used for the active elements, heat generated in the channel region of the FET has an effect on active elements included in other thin-film device layers, which may cause unstable operation. Moreover, when a plurality of thin-film device layers are deposited, it is hard for active elements included in the thin-film device layers placed in the central part to discharge heat, which may cause thermal degradation.

In consideration of the above-mentioned issues, aspects of the present invention attempt to provide a highly reliable electrical device having a multi-layered structure of a plurality of thin-film device layers and a method for manufacturing the same.

In order to address the above-mentioned issues, an electrical device according to one aspect of the present invention includes a plurality of thin-film layers deposited and including a plurality of thin-film device layers each having a semiconductor device, and a conductive layer with predetermined thermal conductivity provided between at least any of the thin-film layers that are placed next to each other.

Since this illustrative structure of the present invention includes the conductive layer with thermal conductivity placed near the thin-film device layers, heat generated in each of the thin-film device layers can be discharged through this conductive layer. Therefore, this structure prevents thermal degradation of the thin-film devices, and can provide a highly reliable electrical device with a long product life.

Examples of materials of the conductive layer include metals (e.g. copper, aluminum), metal compounds (e.g. metal oxides such as aluminum oxide and silicon oxide, and metal nitrides such as silicon nitride), resins with a fibrous or particulate metal or metal compound dispersed (e.g. anisotropic, electrically conductive adhesives), and electrically conductive polymers (e.g. polyacetylene). By using these materials with sufficient thermal conductivity, heat generated in the thin-film device layers can be discharged externally.

Regarding the conductive layer, at least a region corresponding to a heating region included in the thin-film device layers can be made of a thermally conductive material. This structure enables thermal diffusion by transmitting heat generated in the thin-film device layers to the conductive layer.

The thin-film layers can include a transistor, and the conductive layer includes a region corresponding to a channel part included in the transistor and a transmission region (channel) for discharging heat from the region corresponding to the channel part, where each of the regions is made of a thermally conductive material.

Since the region corresponding to the channel part of a FET, generating a large amount of heat, and the channel for discharge heat from this region are made of a material with thermal conductivity, it is possible to efficiently discharge heat generated in the channel part.

The thin-film layers can include a transistor; and the conductive layer includes a region corresponding to a channel part included in the transistor and a transmission region for discharging heat from the region corresponding to the channel part, wherein each region is made of a high thermally conductive material, and also includes another region made of an insulating material other than the region corresponding to the channel part and the transmission region. Since only the regions generating a large amount of heat and requiring heat discharge are made of a high thermally conductive material, while the other region is made of an insulating material, it is possible to efficiently discharge heat. Furthermore, for example, since the region corresponding to the wiring and the like provided in the thin-film device layers is made of an insulating material, it is possible to reduce parasitic capacitance generated in the wiring and the like.

The thin-film layers can include a transistor, and the conductive layer includes a second region other than a first region corresponding to a channel part included in the transistor, the second region being made of a mesh of a thermally conductive material. Since only the region generating a large amount of heat and requiring heat discharge is made of a tight layer, while the other region is made of a mesh, it is possible to efficiently discharge heat from the region generating a large amount of heat. Furthermore, for example, since the region corresponding to the wiring and the like provided in the thin-film device layers is made of a mesh, it is possible to reduce parasitic capacitance generated in the wiring and the like.

The conductive layer can be thermally coupled to a radiator. This structure enables more efficient heat discharge. Also, the conductive layer can have electrical conductivity and be electrically grounded. This structure prevents, for example, interference caused by electromagnetic waves generated between the wirings provided in the thin-film device layers.

The electrical device can include at least four of the thin-film layers, and a conductive layer provided between any of the thin-film layers on the inner side in the direction of layer formation of the electrical device is formed to be thicker than a conductive layer on the outer side. Thus by forming a conductive layer which is placed inside and tends to retain heat to be thicker than another conductive layer on the outer side, it is possible to efficiently discharge heat retained inside the electrical device.

The electrical device includes at least four of the thin-film layers, and a conductive layer provided between any of the thin-film layers on the inner side in the direction of layer formation of the electrical device is made of a material with a thermal conductivity higher than the thermal conductivity of a conductive layer on the outer side. Thus by forming a conductive layer, which is placed inside and tends to retain heat, made of a material with a thermal conductivity higher than the thermal conductivity of another conductive layer on the outer side, it is possible to efficiently discharge heat retained inside the electrical device.

An electrical device according to another aspect of the present invention includes a plurality of thin-film layers deposited and including a plurality of thin-film device layers each having a semiconductor device, and an electrically conductive layer with predetermined electrical conductivity provided between at least any of the thin-film layers that are placed next to each other. Here, the electrically conductive layer is electrically grounded. This structure prevents, for example, interference caused by electromagnetic waves generated between the wirings provided in the thin-film device layers, and thereby provides highly reliable electronic equipment with a long product life. The electrically conductive layer is made of an electrically conductive material, such as metals and metal oxides.

A method for manufacturing an electrical device according to yet another aspect of the present invention includes the following steps: a first step of peeling off a first transferred layer from a first substrate so as to transfer the first transferred layer onto a transfer body, a second step of forming a conductive layer made of an electrically conductive material on the first transferred layer, and a third step of peeling off a second transferred layer from a second substrate so as to transfer the second transferred layer onto the conductive layer. Since this method employs peeling-off and transferring, it is easy to form an electrical device by stacking thin-film device layers with a conductive layer therebetween.

The electrically conductive material may be a metal foil, and in the second step the metal foil may be deposited on the first transferred layer with an adhesive layer therebetween. Moreover, the electrically conductive material may be a metal, and in the second step a film of the metal may be deposited by sputtering on the first transferred layer. Therefore, the conductive layer can be formed easily.

Furthermore, the method can include the step of patterning the film of the metal. Thus, unnecessary portions of the metal film can be removed easily.

DETAILED DESCRIPTION OF THE INVENTION

Embodiments of the present invention will be described with reference to the accompanying drawings.

First Embodiment

Figure 1:
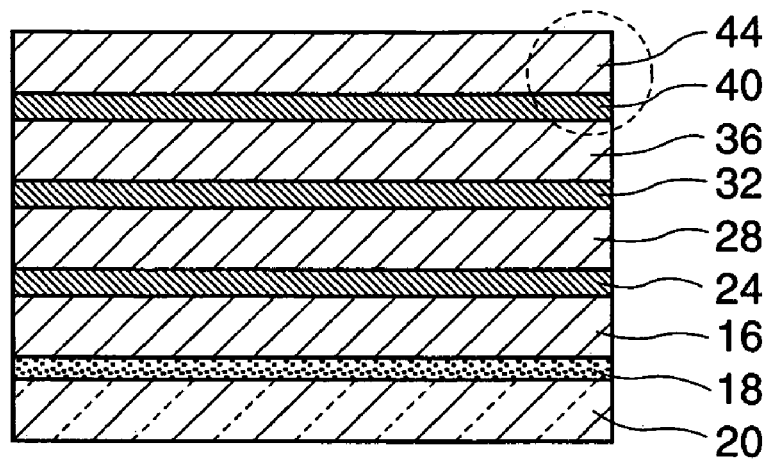
FIG. 1 shows an example of an electrical device according to a first embodiment of the present invention.
Figure 2:
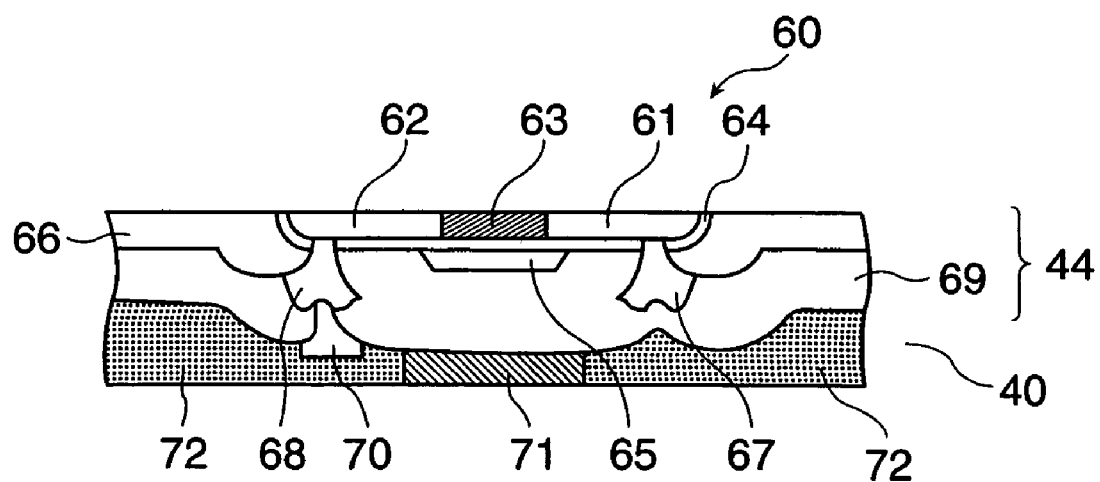
FIG. 2 is an enlarged view showing the portion marked by the dashed line in FIG. 1.

FIG. 1 shows an example of an electrical device according to a first embodiment of the present invention. FIG. 2 is an enlarged view showing the portion marked by the broken line in FIG. 1. Referring to FIG. 1, the electrical device of the present embodiment has a structure in which conductive layers 24, 32, 40 are sandwiched by a plurality of thin-film device layers 16, 28, 36, 44.

Referring to FIG. 2, the thin-film device layer 44 includes a thin-film transistor (TFT) 60. The TFT 60 includes, for example, a source layer (n+ or p+ layer) 61 and a drain layer (n+ or p+ layer) 62 that are formed by doping an n-type or p-type impurity into a polysilicon layer; a channel layer 63; a gate insulating film 64; a gate electrode 65; an interlayer insulating film 66; electrodes 67, 68; and a protective film 69. The protective film 69 is made of, for example, a silicon oxide film. Via a contact hole formed in the protective film 69, a coupling terminal 70 is electrically coupled to the electrode 68. The electrodes 67, 68 and the coupling terminal 70 are made of aluminum, for example. The same can be said about the thin-film device layers 16, 28, 36. Of the conductive layer 40, at least a region 71 corresponding to the channel layer 63 and a channel (not shown) for discharging heat extending from the region 71 to the outside of the electrical device are made of a material with high thermal conductivity (high thermally conductive material), whereas the other region 72 is made of an insulating material in the present illustrative embodiment shown in FIG. 2.

Examples of the high thermally conductive material include metals such as copper and aluminum. As the insulating material, metal oxides such as silicon oxide, metal nitrides such as silicon nitride, and polymer materials can be used.

The thickness of the conductive layers 24, 32, 40 can be, but is not limited to, about 0.1 μm to realize sufficient thermal insulating effects. The thicker the conductive layers 24, 32, 40 are, the better for thermal insulating purposes. However, so as not to make the electrical device too large, the conductive layers are formed to have an adequate thickness from the standpoint of both thermal insulating effects and reduction in electrical device size.

While the conductive layer 40 is made of a high thermally conductive material and an insulating material as shown in FIG. 2 in the present example, the present invention is not so limited. Of the conductive layer 40, the region 71 corresponding to the channel region 63 that generates a large amount of heat can be made of a tight film of a thermally conductive material, whereas the other region can be made of a mesh of such thermally conductive material. Except for electrical coupling parts between each of the thin-film device layers, almost the entire surface of the thin-film device layers can be covered by an electrically conductive material with high thermal conductivity.

Also, while the above example uses the thin-film devices including TFT as a transferred layer, a thin-film diode, photoelectric conversion element, switching element, etc. can also be used instead. Examples of such a transferred layer include memories such as dynamic RAM (DRAM), static RAM (SRAM), EEPROM, and ROM and memory cell arrays; logic circuits such as CPU; and optical and magnetic sensors.

An example of a method for manufacturing an electrical device according to the present illustrative embodiment will now be explained with reference to FIGS. 3 through 5. FIGS. 3 through 5 show an example of the method for manufacturing an electrical device according to the present illustrative embodiment.

Figure 3A:
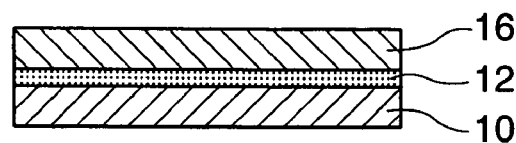
FIG. 3A shows a first step of manufacturing an electrical device having a separating layer formed on one side of a substrate with a first transferred layer formed on the separating layer.

Referring to FIG. 3A, a separating layer 12 is formed on one side of a substrate 10, and the first transferred layer 16 is formed on the separating layer 12 with an intermediate layer therebetween as necessary.

First, the separating layer 12 is formed on the substrate 10. The substrate 10 is preferably made of a transmissive material that is capable of transmitting irradiation light 23 used in a later step, for example. Also, when the separating layer 12 and the first transferred layer 16 are formed at a temperature Tmax or less, the substrate 10 is preferably made of a material whose strain point is at Tmax or more.

The separating layer 12 absorbs irradiation light (the irradiation light 23, for example), and the resulting separation takes place inside or on the boundary of the layer (hereinafter referred to as "interlayer separation" or "boundary separation"). When irradiated with light, interatomic or intermolecular bonding forces in the components of the separating layer 12 can be reduced or obliterated, and thereby the resulting ablation causes interlayer separation and/or boundary separation.

Moreover, when irradiated with light, the separating layer 12 may discharge gas that causes such separation. In short, components contained in the separating layer 12 are discharged in the form of gas, otherwise the separating layer 12 absorbs light, turning its components to gas for a moment, and then discharges the gas, and thereby separation takes place.

The separating layer 12 may be made of amorphous silicon (a—Si), for example. The separating layer 12 may also include a multilayered film. Such a multilayered film may be composed of an amorphous silicon film and a metal film of Al, for example, formed thereon. Alternatively, ceramics, metals, organic polymers, and other materials having the above-mentioned properties can also be used.

A method for forming the separating layer 12 is not specifically limited, and can be adequately determined depending on various conditions, such as film composition and thickness. For example, various vapor-phase film forming methods such as CVD and sputtering, various plating methods, coating methods such as spin coating, various printing methods, transfer methods, inkjet coating, and power jetting, and a combination of two or more of these methods can be used. Next, the thin-film device layer (e.g. a layer including a thin-film transistor) 16 as the first transferred layer is formed on the separating layer 12. As needed, a coupling terminal, wiring, or the like for electrical coupling to an external device can be provided (see FIG. 2).

Depending on the properties of the separating layer 12 and the first transferred layer 16, an intermediate layer (not shown in FIG. 3A) may be provided between the substrate 10 and the separating layer 12 in order to improve adhesiveness between the two layers, protect the thin-film device layer 16 as the first transferred layer, and for other reasons. The intermediate layer may function as at least one of the following: a protective layer that physically or chemically protects the first transferred layer when it is manufactured or used; an insulating layer; a barrier layer that prevents the migration of components into or from the first transferred layer; and a reflective layer.

Figure 3B:
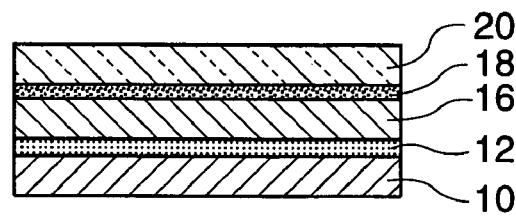
FIG. 3B shows a second step of manufacturing an electrical device showing the electrical device as including a transfer body bonded on the first transferred layer by an adhesive layer.

As shown in FIG. 3B, a transfer body 20 to be a subject on which the transferred layer is transferred is bonded on the thin-film device layer 16 with an adhesive layer 18 therebetween. The transfer body 20 used in the present invention may be either a substrate, sheet, or film. Materials of the transfer body 20 are not limited, and can be resin or glass materials, for example.

Permanent adhesive materials can be used as a component of the adhesive layer 18. Examples of these materials include reaction curing adhesives, thermosetting adhesives, light cure (e.g. ultraviolet curing) adhesives, and anaerobic curing adhesives. The composition of such adhesives may be epoxy, acrylate, or silicone.

Figure 3C:
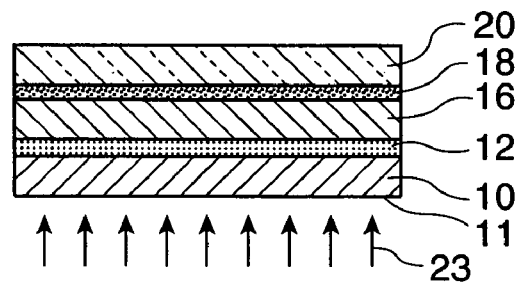
FIG. 3C shows a third step of manufacturing an electrical device including a substrate being separated from a first transferred layer.
Figure 3D:
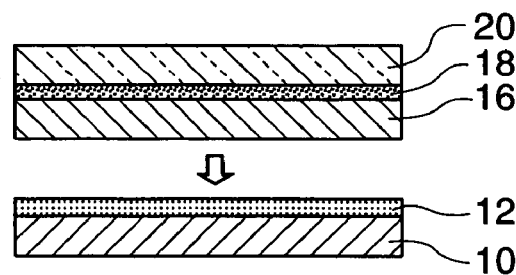
FIG. 3D shows a fourth step of manufacturing an electrical device including a transfer body mounted to a first transferred layer by an adhesive layer.

As shown in FIGS. 3C and 3D, the separating layer 12 is irradiated with the light 23 from a back side 11 of the substrate 10, so as to separate the substrate 10 from the first transferred layer 16. The separating layer 12 is irradiated with the irradiation light 23 passing through the substrate 10. Accordingly, interlayer separation and/or boundary separation take place in the separating layer 12. Here, the interlayer separation and/or boundary separation in the separating layer 12 are caused as a result of the ablation of components of the separating layer 12, the discharge of gas contained in the separating layer 12, and phase changes, such as melting and transpiration, following the irradiation.

Here, "ablation" refers to a phenomenon in which stationary materials (components of the separating layer 12)

that absorb the irradiation light are photochemically or thermally excited, resulting in breaking the bonding force between atoms or molecules on the surface of or inside the layer and discharging them. It is mainly seen as resulting phase changes, such as melting and transpiration (evaporation) of the whole or part of the components of the separating layer 12; Moreover, such phase changes form micro bubbles, which reduce the bonding force.

Examples of the light source of the irradiation light 23 may include X-rays, ultraviolet rays, visible light, infrared rays, laser light, millimeter waves, microwaves, electron beams, and radiation rays. Among others, laser light is preferably used since it can easily cause ablation. Examples of such laser light may be either air or solid (semiconductor) laser, and Nd—YAG, Ar, CO2, CO, He—Ne lasers can be used, and an excimer laser is preferably used.

Figure 3E:
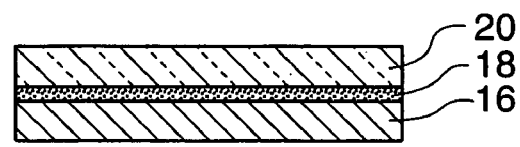

Subsequently, the substrate 10 and the transfer body 20 are separated as shown in FIG. 3D. For example, the substrate 10 is separated from the transfer body 20 by applying force on the substrate 10 and the transfer body 20 for separating the two. Since the bonding force between the first transferred layer 16 and the substrate 10 is reduced by the light irradiation, peeling-off and transferring are easily carried out. Consequently, the transfer body 20 on which the first transferred layer 16 is transferred is completed as shown in FIG. 3E.

While the separating layer 12 is attached to the substrate 10 referring to FIG. 3D, separation may take place inside the separating layer 12 or between the separating layer 12 and the substrate 10. In such a case, the separating layer 12 is attached to the first transferred layer 16. Here, the separating layer 12 attached to the first transferred layer 16 can be removed by washing, etching, ashing, or other means.

Figure 4A:
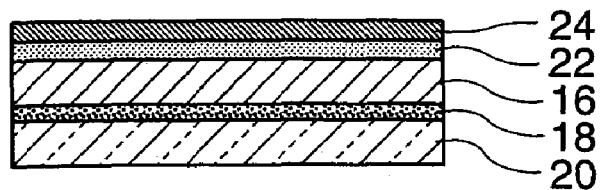
FIG. 4A shows a first step of manufacturing an electrical device including a transfer body having a first transferred layer, an adhesive layer, and a metal layer supported thereon.
Figure 5:
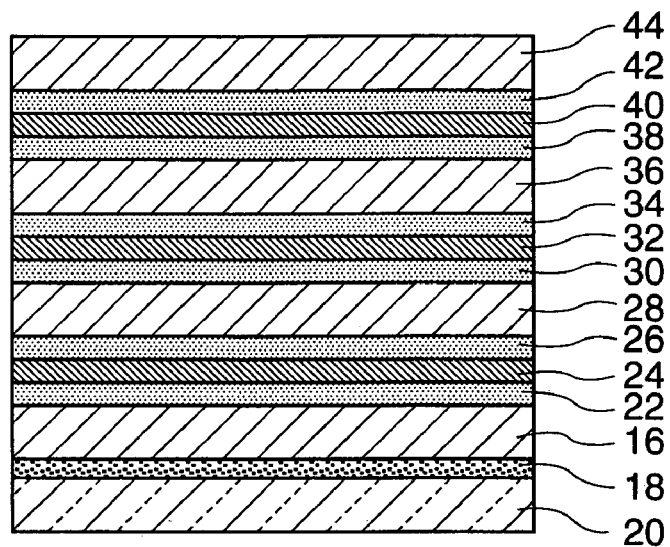
FIG. 5 shows an example of the method for manufacturing an electrical device according to the present embodiment.

As shown in FIG. 4A, a metal layer 24 as a conductive layer is formed on the thin-film device layer 16 with an adhesive layer 22 therebetween. More specifically, the adhesive layer 22 may be formed by, for example, applying an adhesive material similar to that used to form the adhesive layer 18. Then, a metal foil of aluminum, copper, or the like can be adhered onto the adhesive layer 22. The metal foil may be formed with a desired pattern in advance.

Figure 4B:
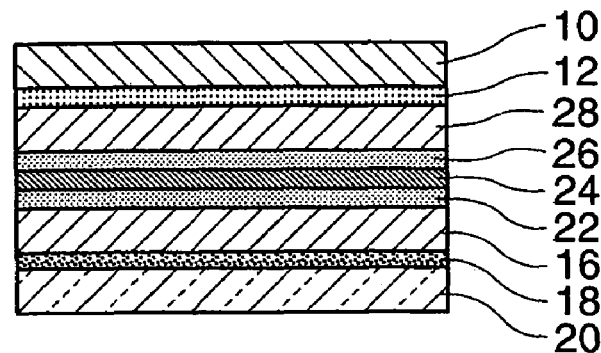
FIG. 4B shows a second step of manufacturing an electrical device having a second transferred layer and a substrate mounted to the metal layer of FIG. 4A.
Figure 4C:
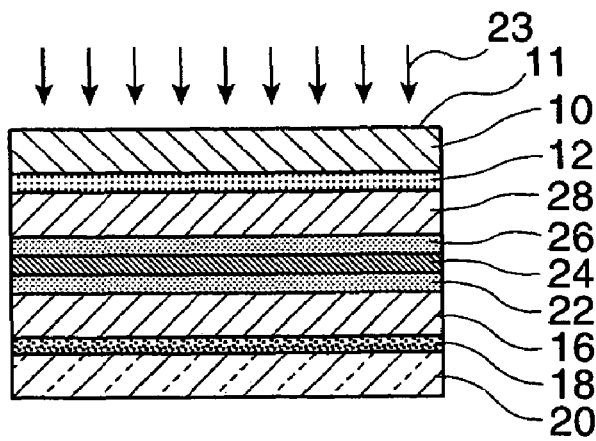
FIG. 4C shows a third step of manufacturing an electrical device having irradiation light applied to the substrate of FIG. 4B.
Figure 4D:
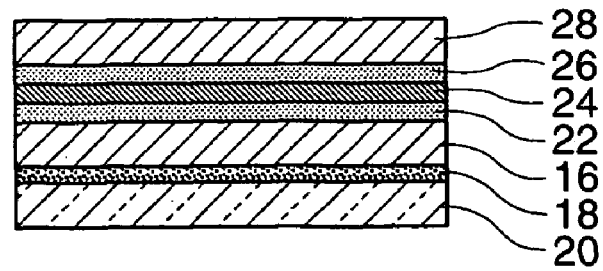
FIG. 4D shows a fourth step of manufacturing an electrical device having the substrate of FIG. 4C removed from the second transferred layer.

As shown in FIG. 4B, the substrate 10 is provided with the second transferred layer 28 with the separating layer 12 therebetween in the same manner as the step shown in FIG. 3A, and is bonded onto the metal layer 24 with an adhesive layer 26 therebetween. To make the adhesive layer 26, an adhesive material similar to that used to form the adhesive layer 18 can be used. Subsequently, as shown in FIG. 4C, the back side 11 of the substrate 10 is irradiated with the irradiation light 23, so as to separate the substrate 10 from the second transferred layer 28. As a result, an electrical device having a multilayered structure as FIG. 4D shows can be manufactured.

By repeating the steps shown in FIGS. 4A through 4C, an electrical device having the multilayered structure of the thin-film device layers 16, 28, 36, 44 and the metal layers 24, 32, 40 as the conductive layers can be formed as shown in FIG. 5.

According to the present illustrative embodiment, since the conductive layers 24, 32, 40 having thermal conductivity are provided between each of the thin-film device layers 16, 28, 36, 44, heat generated in each thin-film device is discharged through these conductive layers. This structure prevents thermal degradation of such thin-film devices, and thereby provides a highly reliable electrical device with a long product life.

Of the electrical device according to the present illustrative embodiment, for example, the region 71 corresponding to the channel layer 63 included in the conductive layer 40 is made of a material with high thermal conductivity, while the other region 72 is made of an insulating material. Therefore, efficiency in discharging heat from the region with a high calorific value (the region 71 corresponding to the channel layer 63) is increased. At the same time, making the region 72 of an insulating material can reduce parasitic capacitance generated in a circuit component provided in the thin-film device layer and by the conductive layer 40, for example.

Since the method for manufacturing an electrical device of the present illustrative embodiment employs peeling-off and transferring, it is easy to stack thin-film devices with the conductive layers 24, 32, 40 therebetween. Also, using a metal foil makes it easy to form the conductive layers 24, 32, 40; that is, they can be formed merely by a bonding step.

While the electrical device in the above-mentioned example has the four thin-film device layers, the present invention is not so limited. Two, three or more than four thin-film device layers can be deposited instead.

Modification 1

Figure 6:
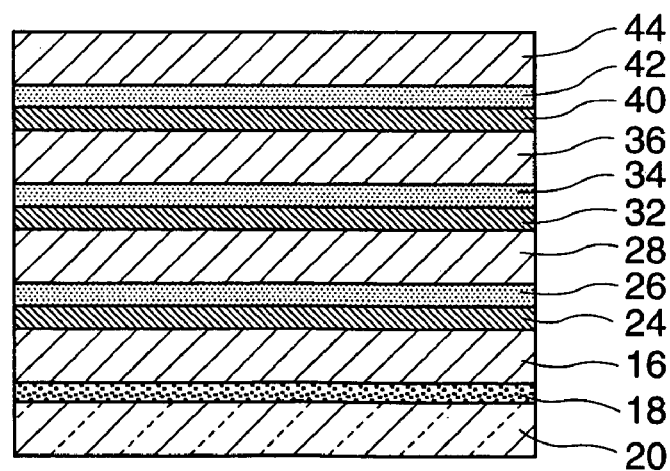
FIG. 6 shows a modification of the electrical device according to the present embodiment.

While the conductive layers 24, 32, 40 are formed by bonding a metal foil in the above-mentioned example, the present invention is not so limited. The layers may also be formed by sputtering or depositing a metal material of aluminum, copper, or the like. More specifically, after the step shown in FIG. 3E, a metal material of aluminum, copper, or the like can be sputtered or deposited directly on the transferred layer 16 so as to form the conductive layer 24. Subsequently, the second transferred layer 28 provided on the substrate 10 can be bonded with the adhesive layer 26 therebetween in the same manner as the step shown in FIG. 4B. By repeating this step, the electrical device shown in FIG. 6 can be manufactured. Alternatively, after forming the conductive layer 24, the conductive layer 24 may be patterned desirably by etching or other processing.

Accordingly, the conductive layers 24, 32, 40 can be formed by sputtering or deposition directly on the transferred layer 16 without an adhesive layer therebetween, which makes it possible to transmit heat to the conductive layers 24, 32, 40 more efficiently.

Modification 2

In the above-mentioned embodiment, the conductive layers 24, 32, 40 are formed to almost the same thickness. In this example, efficiency in discharging heat from a region that tends to hold heat and from another region that does not have such a tendency can be changed by making the thicknesses of the conductive layers 24, 32, 40 different.

Figure 7:
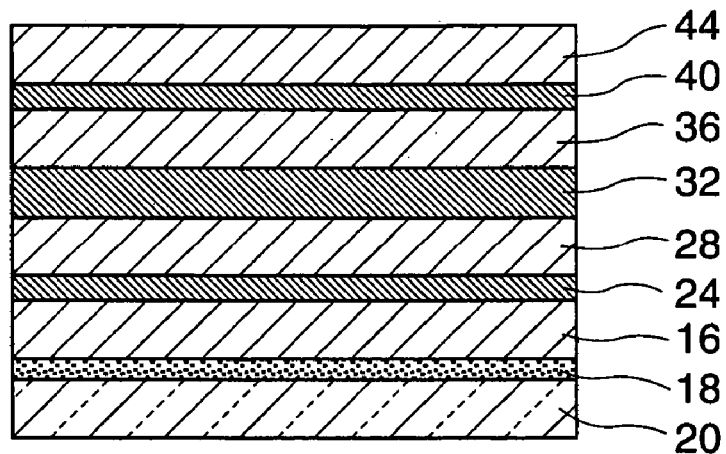
FIG. 7 shows an example of an electrical device including conductive layers of different thicknesses.

FIG. 7 shows an example of an electrical device including conductive layers of different thicknesses. Referring to FIG. 7, the conductive layer placed on the inner side of the electrical device (i.e. the conductive layer 32) is formed to be thicker than the conductive layers placed on the outer side (i.e. the conductive layers 24, 40). This way, by forming the conductive layer 32, which is placed inside and tends to retain heat, to be thicker than the other conductive layers 24, 40, it is possible to increase efficiency in discharging heat. This example provides a convenient way of changing the heat discharge efficiency of each conductive layer merely by changing their thicknesses.

Modification 3

In this example, instead of changing the thicknesses of the conductive layers 24, 32, 40, different materials can be used for making up the conductive layers 24, 32, 40 so as to change efficiency in discharging heat from each of the layers.

Figure 8:
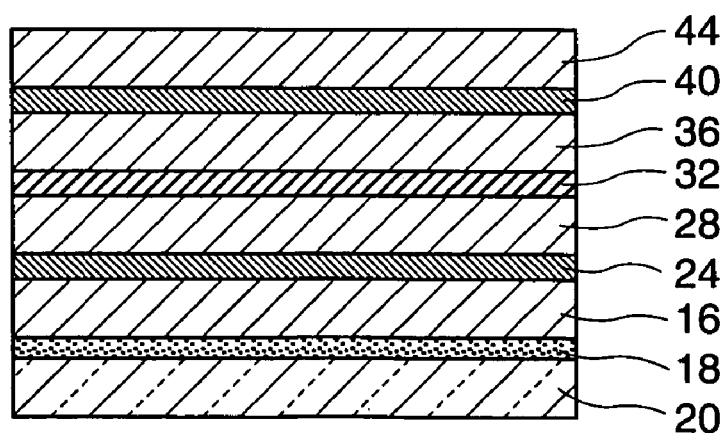
FIG. 8 shows an example of an electrical device including conductive layers of different materials.

FIG. 8 shows an example of an electrical device including conductive layers of different materials. Referring to FIG. 8, the conductive layer placed on the inner side of the electrical device in the direction of layer formation (i.e. the conductive layer 32) is made of a material with a thermal conductivity higher than a thermal conductivity of the conductive layers placed on the outer side (i.e. the conductive layers 24, 40). This structure can further improve efficiency in discharging heat from the conductive layer 32, which is placed inside and tends to retain heat. More specifically, for example, copper, whose thermal conductivity is high, is used for making up the conductive layer 32 placed at the center, whereas aluminum or a metal oxide whose thermal conductivity is lower than that of copper is used for making up the conductive layers 24, 40 placed on the outer side. This structure can further improve efficiency in discharging heat from the conductive layer 32, which is placed on the inner side of the electrical device and tends to retain heat. Therefore, this structure enables efficient heat discharge.

Furthermore, an electrical device can be formed in combination with the second and third modifications.

Second Embodiment

Figure 9:
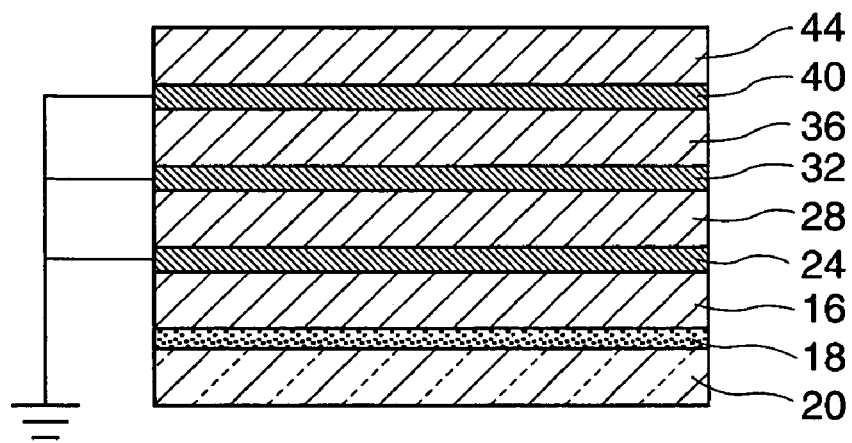
FIG. 9 shows an example of an electrical device according to another embodiment of the present invention.

FIG. 9 shows an example of an electrical device according to another illustrative embodiment of the present invention. Referring to FIG. 9, the conductive layers 24, 32, 40 are made of electrically conductive materials, e.g. metal materials. By grounding the conductive layers 24, 32, 40, interference caused by electromagnetic waves generated between each of the thin-film device layers 16, 28, 36, 44 can be blocked. As a result, a more reliable electrical device can be provided.

Third Embodiment

Figure 10:
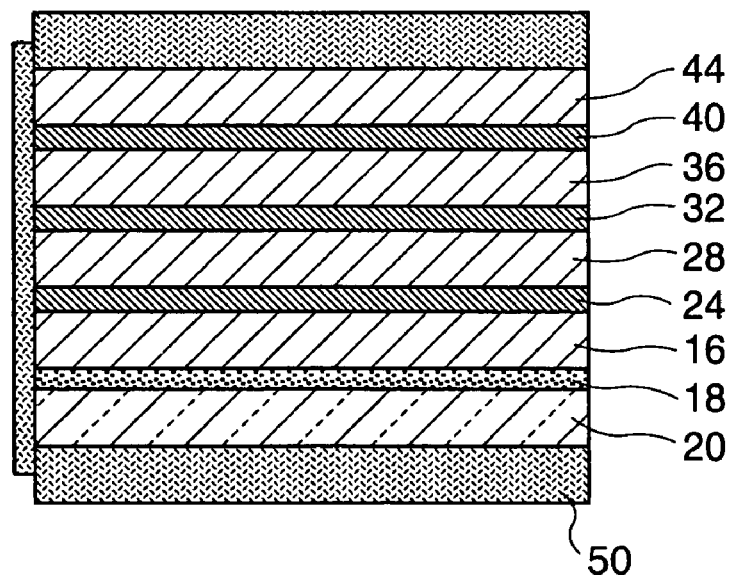
FIG. 10 shows an example of an electrical device according to yet another embodiment of the present invention.

FIG. 10 shows an example of an electrical device according to another illustrative embodiment of the present invention. Referring to FIG. 10, for example, a radiator 50 is provided on the both sides of the electrical device. By transmitting heat discharged through the conductive layers 24, 32, 40 to the radiator 50, it is possible to improve the heat discharge efficiency.

The radiator 50 may include a cooling medium or cooling liquid (not shown). Materials of the radiator 50 are not particularly limited, but can be made of aluminum or an alloy thereof for thermal conductivity, processability, and reliability purposes. These materials have comparatively high thermal conductivity (around 200 W/mK), can be easily processed, and can be easily plastically deformed. Therefore, it is possible to alleviate stress imposed on a mounting part, and thus a highly reliable electrical device can be achieved.

Electrical devices manufactured by the above-mentioned methods can be used for memory ICs (memory devices), system ICs (system LSIs), and for other purposes.

The invention claimed is:

1. An electrical device comprising:
 a plurality of thin-film layers including a plurality of thin-film device layers each having a semiconductor device, the thin-film layers including a transistor having a channel region; and
 a conductive layer with predetermined thermal conductivity provided between adjacent thin-film layers, the conductive layer including a first region that overlaps the channel region and a transmission region that discharges heat from the first region, the first region and the transmission region including a thermally conductive material.

2. The electrical device according to claim 1, wherein the conductive layer includes a metal, metal compound, resin with a metal or metal compound dispersed, or an electrically conductive polymer.

3. The electrical device according to claim 1, wherein the conductive layer includes a second region including an insulating material.

4. The electrical device according to claim 1, wherein the transmission region of the conductive layer includes a mesh of a thermally conductive material.

5. The electrical device according to claim 1, wherein the conductive layer is thermally coupled to a radiator disposed adjacent to one of the plurality of thin-film device layers.

6. The electrical device according to claim 1, wherein the conductive layer has electrical conductivity and is electrically grounded.

7. The electrical device according to claim 1, further comprising:
 a stack of at least four of the thin-film layers; and
 at least three of the conductive layers, each being provided between different adjacent thin film layers;
 wherein a conductive layer on an inner side of the stack of thin-film layers is formed to be thicker than a conductive layer on an outer side.

8. The electrical device according to claim 1, further comprising:
 at least four of the thin-film layers; and
 at least three of the conductive layers, each being provided between different adjacent thin film layers;
 wherein a conductive layer provided on an inner side of the stack of thin-film layers is made of a material with higher thermal conductivity than a conductive layer on an outer side.

9. An electrical device comprising:
 a plurality of thin-film layers including a plurality of thin-film device layers each having a semiconductor device; and
 a conductive layer with predetermined thermal conductivity provided between adjacent thin-film layers;
 wherein the thin-film layers include a transistor having a channel and the conductive layer includes a first region corresponding to the channel region and a second region, the second region being made of a mesh of a thermally conductive material.

10. An electrical device comprising:
 at least four thin-film layers including a plurality of thin-film device layers each having a semiconductor device; and
 at least three conductive layers with predetermined thermal conductivity provided between different adjacent thin-film layers;
 wherein a conductive layer on an inner side of the electrical device is formed to be thicker than a conductive layer on an outer side.

11. An electrical device comprising:
 at least four thin-film layers including a plurality of thin-film device layers each having a semiconductor device; and
 at least three conductive layers with predetermined thermal conductivity provided between different adjacent thin-film layers;
 wherein a conductive layer provided on an inner side of the electrical device is made of a material with higher thermal conductivity than a conductive layer on an outer side.

* * * * *